(12) United States Patent
Kurita et al.

(10) Patent No.: US 9,116,427 B2
(45) Date of Patent: Aug. 25, 2015

(54) COMPOSITION FOR FORMING RESIST UNDERLAYER FILM AND PATTERN-FORMING METHOD

(71) Applicant: JSR CORPORATION, Tokyo (JP)

(72) Inventors: Shunsuke Kurita, Tokyo (JP); Kazunori Takanashi, Tokyo (JP); Hiromitsu Nakashima, Tokyo (JP); Tooru Kimura, Tokyo (JP)

(73) Assignee: JSR CORPORATION, Tokyo (JP)

( * ) Notice: Subject to any disclaimer, the term of this patent is extended or adjusted under 35 U.S.C. 154(b) by 92 days.

(21) Appl. No.: 13/787,674

(22) Filed: Mar. 6, 2013

(65) Prior Publication Data

US 2013/0233825 A1    Sep. 12, 2013

(30) Foreign Application Priority Data

Mar. 7, 2012 (JP) .................... 2012-050956
Jan. 30, 2013 (JP) .................... 2013-016155

(51) Int. Cl.
*G03F 7/11* (2006.01)
*G03F 7/075* (2006.01)
*G03F 7/40* (2006.01)
*G03F 7/09* (2006.01)

(52) U.S. Cl.
CPC ............ *G03F 7/0757* (2013.01); *G03F 7/0752* (2013.01); *G03F 7/094* (2013.01)

(58) Field of Classification Search
None
See application file for complete search history.

(56) References Cited

U.S. PATENT DOCUMENTS

| 7,175,967 | B1 * | 2/2007 | Mulligan et al. ............ 430/271.1 |
| 7,297,464 | B2 * | 11/2007 | Sakurai et al. ............. 430/270.1 |
| 2003/0120018 | A1 * | 6/2003 | Baldwin et al. ................. 528/39 |
| 2008/0206690 | A1 * | 8/2008 | Kennedy et al. .............. 430/496 |
| 2013/0210236 | A1 * | 8/2013 | Ogihara et al. ............... 438/706 |
| 2013/0233826 | A1 * | 9/2013 | Seko et al. ...................... 216/47 |

FOREIGN PATENT DOCUMENTS

JP        2002-040668        2/2002

* cited by examiner

*Primary Examiner* — Cynthia Hamilton
(74) *Attorney, Agent, or Firm* — Oblon, McClelland, Maier & Neustadt, L.L.P.

(57) ABSTRACT

A composition for forming a resist underlayer film includes a polysiloxane and a solvent. The solvent includes an organic solvent having a standard boiling point of no less than 150.0° C., and water. A content of the organic solvent is no less than 1% by mass and no greater than 50% by mass with respect to a total amount of the solvent. A content of water is no less than 1% by mass and no greater than 30% by mass with respect to the total amount of the solvent.

13 Claims, No Drawings

COMPOSITION FOR FORMING RESIST UNDERLAYER FILM AND PATTERN-FORMING METHOD

CROSS-REFERENCE TO RELATED APPLICATIONS

The present application claims priority under 35 U.S.C. §119 to Japanese Patent Application No. 2012-050956, filed Mar. 7, 2012 and to Japanese Patent Application No. 2013-016155, filed Jan. 30, 2013. The contents of these applications are incorporated herein by reference in their entirety.

BACKGROUND OF THE INVENTION

1. Field of the Invention

The present invention relates to a composition for forming a resist underlayer film, and a pattern-forming method.

2. Discussion of the Background

In manufacturing semiconductor devices, multilayer resist processes have been employed for attaining a high degree of integration. In these processes, a composition for forming a resist underlayer film is first coated on a substrate to provide a resist underlayer film, and then a resist composition is coated on the resist underlayer film to provide a resist film. Thereafter, a resist film is exposed through a mask pattern by means of a stepping projection aligner (stepper) or the like, and developed with an appropriate developer solution to form a resist pattern. Subsequently, the resist underlayer film is dry-etched using the resist pattern as a mask, and the substrate is further dry-etched using the resultant resist underlayer film pattern as a mask, thereby enabling a desired pattern to be formed on the substrate.

In recent years, in order to further increase the degree of integration, miniaturization of patterns has been further in progress. Also in connection with the multilayer resist processes described above, structures of polymers, etc., contained in the composition for forming a resist underlayer film, and functional groups included in the polymers have been variously investigated. For resist underlayer films proposed so far, a composition for forming a resist underlayer film containing a hydrolytic condensate of a compound that includes a certain hydrolyzable silane compound, and the like are exemplified (see Japanese Unexamined Patent Application, Publication No. 2002-40668).

SUMMARY OF THE INVENTION

According to one aspect of the present invention, a composition for forming a resist underlayer film includes a polysiloxane and a solvent. The solvent includes an organic solvent having a standard boiling point of no less than 150.0° C., and water. A content of the organic solvent is no less than 1% by mass and no greater than 50% by mass with respect to a total amount of the solvent. A content of water is no less than 1% by mass and no greater than 30% by mass with respect to the total amount of the solvent.

According to another aspect of the present invention, a pattern-forming method includes providing a resist underlayer film on a substrate using the composition. A resist film is provided on the resist underlayer film using a resist composition. The resist film is exposed by irradiation with a radioactive ray through a mask. The exposed resist film is developed to form a resist pattern. The resist underlayer film and the substrate are sequentially dry-etched using the resist pattern as a mask.

DESCRIPTION OF THE EMBODIMENTS

An aspect of the embodiment of the present invention made for solving the foregoing problems provides a composition for forming a resist underlayer film that includes:
a polysiloxane (hereinafter, may be also referred to as "polysiloxane (A)"); and
a solvent (hereinafter, may be also referred to as "solvent (B)"),
wherein the solvent includes:
an organic solvent having a standard boiling point of no less than 150.0° C. (hereinafter, may be also referred to as "organic solvent (B1)"); and
water (hereinafter, may be also referred to as "water (B2)"), and
wherein the content of the organic solvent is no less than 1% by mass and no greater than 50% by mass with respect to the total amount of the solvent, and
the content of water is no less than 1% by mass and no greater than 30% by mass with respect to the total amount of the solvent.

When the solvent (B) includes the organic solvent (B1) and the water (B2) at a content falling within a specified range described above, the composition for forming a resist underlayer film can exhibit a superior inhibitory property of coating defects, and storage stability, i.e., an increase of coating defects, alteration of the film thickness of a resultant coated film, and the like are less likely to occur even after storage for a long period of time. Although the reasons for achieving such effects by the solvent (B) constituted as described above are not necessarily clear, it is envisaged, for example, that due to containing the organic solvent (B1) that is a high-boiling point solvent, and containing the water (B2) in a given quantity or more, volatilization of a solvent in a nozzle during coating, and the like can be suppressed, thereby enabling generation of coating defects to be inhibited, and modification of silanol groups included in the composition for forming a resist underlayer film to be suppressed, leading to improvement of the storage stability.

The standard boiling point of the organic solvent (B1) is preferably no less than 180° C. When the standard boiling point of the organic solvent (B1) falls within the range specified above, the composition for forming a resist underlayer film can attain an improved inhibitory property of coating defects, and storage stability.

The organic solvent (B1) is preferably an ester, an alcohol, an ether or a combination thereof. When the organic solvent (B1) is the solvent specified above, the composition for forming a resist underlayer film can attain an improved inhibitory property of coating defects, and storage stability.

The organic solvent (B1) is preferably a lactone, a carbonate, a compound represented by the following formula (B-1) or a combination thereof. When the organic solvent (B1) is the solvent specified above, the composition for forming a resist underlayer film can attain an improved inhibitory property of coating defects, and storage stability.

(B-1)

In the formula (B-1), $R^1$ and $R^2$ each independently represent a hydrogen atom, an alkyl group having 1 to 4 carbon atoms or an acyl group having 1 to 4 carbon atoms;

$R^3$ represents a hydrogen atom or a methyl group; n is an integer of 1 to 4, in a case where $R^3$ is present in a plurality of number, a plurality of $R^3$s are each optionally the same or different.

The relative permittivity of the organic solvent (B1) is preferably 13 or greater and 200 or less. relative permittivity of the organic solvent (B1) falls within the range specified above, the composition for forming a resist underlayer film can attain an improved inhibitory property of coating defects, and storage stability.

It is preferred that the solvent (B) further includes (B3) an alcohol other than the organic solvent described above (hereinafter, may be also referred to as "alcohol (B3)"). Accordingly, the composition for forming a resist underlayer film can attain an improved inhibitory property of coating defects, and storage stability.

It is preferred that the composition for forming a resist underlayer film further includes (C) an acid diffusion controller. Accordingly, the composition for forming a resist underlayer film enables diffusion of an acid from a resist film via the resist underlayer film to be inhibited while maintaining the effects described above, whereby pattern developability and the like can be improved.

The polysiloxane (A) is preferably a hydrolytic condensate of a compound that includes a hydrolyzable silane compound represented by the following formula (i) (hereinafter, may be also referred to as "compound (i)").

$$R^A{}_aSiX_{4-a} \qquad (i)$$

In the formula (i), $R^A$ represents a hydrogen atom, a fluorine atom, an alkyl group having 1 to 5 carbon atoms, an alkenyl group having 2 to 10 carbon atoms, an aryl group having 6 to 20 carbon atoms or a cyano group, wherein a part or all of hydrogen atoms included in the alkyl group are not substituted or optionally substituted by an epoxyalkyloxy group, an epoxy group, an acid anhydride group or a cyano group, and a part or all of hydrogen atoms included in the aryl group are not substituted or optionally substituted by a hydroxy group; X represents a halogen atom or $-OR^B$, wherein $R^B$ represents a monovalent organic group; a is an integer of 0 to 3, wherein in a case where $R^A$ and X are each present in a plurality of number, each of a plurality of $R^A$s and a plurality of Xs are each optionally the same or different.

When a hydrolytic condensate of a compound that includes the compound (i) is thus used as the polysiloxane (A), the composition for forming a resist underlayer film can attain an improved inhibitory property of coating defects, and storage stability.

The composition for forming a resist underlayer film of the embodiment of the present invention is suitably used in multilayer resist processes. The composition for forming a resist underlayer film is superior in the inhibitory property of coating defects, and storage stability.

Moreover, a pattern-forming method according to another aspect of the embodiment of the present invention includes:

providing a resist underlayer film on a substrate using the composition for forming a resist underlayer film;

providing a resist film on the resist underlayer film using a resist composition;

exposing the resist film by irradiation with a radioactive ray through a mask;

developing the exposed resist film to form a resist pattern; and sequentially dry-etching the resist underlayer film and the substrate using the resist pattern as a mask.

Since the composition for forming a resist underlayer film of the embodiment of the present invention is used in the pattern-forming method, a resist underlayer film that is superior in the inhibitory property of coating defects can be provided. In addition, even if the composition for forming a resist underlayer film which had been stored for a long period of time is used, favorable patterns can be obtained. Therefore, the pattern-forming method according to the embodiment of the present invention is responsible for formation of a finer pattern on a substrate.

The term "organic group" as referred to herein means a group that includes at least one carbon atom. Herein, the "relative permittivity" as referred to means a ratio of the dielectric constant of the organic solvent (B1) to the dielectric constant of a vacuum measured at 20° C. It is to be noted that with respect to the relative permittivity of the organic solvent (B1), a value described in "Chemical Handbook: Basic Edition; Revised 5th Edition", etc., may be referred to. Also, as the relative permittivity of the organic solvent (B1) not listed in the Chemical Handbook, a value obtained by determining at 20° C. by a method described in JIS C2138 may be referred to.

The composition for forming a resist underlayer film of the embodiment of the present invention is superior in an inhibitory property of coating defects, and storage stability. Therefore, the composition for forming a resist underlayer film and pattern-forming method can be suitably used in lithography processes for which further miniaturization is desired. The embodiments will now be described in detail.

Composition for Forming a Resist Underlayer Film

The composition for forming a resist underlayer film of the embodiment of the present invention contains (A) a polysiloxane and (B) a solvent. In addition, the composition for forming a resist underlayer film may contain (C) an acid diffusion controller as a suitable component. Furthermore, the composition for forming a resist underlayer film may contain other optional component as long as the effects of the present invention are not impaired. Hereinafter, each component will be explained in detail.

(A) Polysiloxane

The polysiloxane (A) is not particularly limited as long as it is a polymer having a siloxane bond, and is preferably a hydrolytic condensate of a compound that includes the hydrolyzable silane compound represented by the above formula (i). The hydrolyzable silane compound used in the synthesis of the polysiloxane (A) may be used either alone of one type, or in combination of two or more types thereof.

In the formula (i), $R^A$ represents a hydrogen atom, a fluorine atom, an alkyl group having 1 to 5 carbon atoms, an alkenyl group having 2 to 10 carbon atoms, an aryl group having 6 to 20 carbon atoms or a cyano group, wherein a part or all of hydrogen atoms included in the alkyl group are not substituted or optionally substituted by an epoxyalkyloxy group, an epoxy group, an acid anhydride group or a cyano group, and a part or all of hydrogen atoms included in the aryl group are not substituted or optionally substituted by a hydroxy group; X represents a halogen atom or $-OR^B$, wherein $R^B$ represents a monovalent organic group; a is an integer of 0 to 3, wherein in a case where $R^A$ and X are each present in a plurality of number, each of a plurality of $R^A$s and a plurality of Xs are each optionally the same or different.

Examples of the alkyl group having 1 to 5 carbon atoms represented by the $R^A$ include linear alkyl groups such as a methyl group, an ethyl group, a n-propyl group, a n-butyl group and a n-pentyl group; branched alkyl groups such as an isopropyl group, an isobutyl group, a sec-butyl group, a t-butyl group and an isoamyl group, and the like. Of these, linear alkyl groups are preferred, and a methyl group is more preferred.

The alkenyl group represented by the $R^A$ is exemplified by groups derived by removing one hydrogen atom from an alkene compound and the like, and examples thereof include an ethenyl group, a 1-propen-1-yl group, a 1-propen-2-yl group, a 1-propen-3-yl group, a 1-buten-1-yl group, a 1-buten-2-yl group, a 1-buten-3-yl group, a 1-buten-4-yl group, a 2-buten-1-yl group, a 2-buten-2-yl group, a 1-penten-5-yl group, a 2-penten-1-yl group, a 2-penten-2-yl group, a 1-hexen-6-yl group, a 2-hexen-1-yl group, a 2-hexen-2-yl group, and the like.

Examples of the aryl group represented by the $R^A$ include a phenyl group, a naphthyl group, a methylphenyl group, an ethylphenyl group, a chlorophenyl group, a bromophenyl group, a fluorophenyl group, and the like. Of these, a phenyl group and a methylphenyl group are preferred. It is to be noted that the aryl group includes aralkyl groups according to the concept herein.

The "epoxy group" in the epoxyalkyloxy group may involve an oxiranyl group and an oxetanyl group, and the epoxyalkyloxy group with which the alkyl group may be substituted is exemplified by a glycidyloxy group, an oxetanylmethyloxy group, and the like.

The epoxy group with which the alkyl group may be substituted is exemplified by an oxiranyl group, an oxetanyl group, and the like.

The acid anhydride group with which the alkyl group may be substituted is exemplified by, e.g., a succinic anhydride group, a maleic anhydride group, a glutaric anhydride group, and the like.

Examples of the alkyl group substituted with a glycidyloxy group include a 2-glycidyloxyethyl group, a 3-glycidyloxypropyl group, a 4-glycidyloxybutyl group, and the like. Of these, a 3-glycidyloxypropyl group is more preferred.

Examples of the alkyl group substituted with an oxetanylmethyloxy group include a 3-ethyl-3-oxetanylmethyloxypropyl group, a 3-methyl-3-oxetanylmethyloxypropyl group, a 3-ethyl-2-oxetanylmethyloxypropyl group, a 2-oxetanylmethyloxyethyl group, and the like. Of these, a 3-ethyl-3-oxetanylmethyloxypropyl group is preferred.

Examples of the alkyl group substituted with an acid anhydride group include a 2-succinic anhydride group-substituted ethyl group, a 3-succinic anhydride group-substituted propyl group, a 4-succinic anhydride group-substituted butyl group, and the like. Of these, a 3-succinic anhydride group-substituted propyl group is more preferred.

Examples of the alkyl group substituted with a cyano group include a 2-cyanoethyl group, a 3-cyanopropyl group, a 4-cyanobutyl group, and the like.

Examples of the aryl group substituted with a hydroxy group include a 4-hydroxyphenyl group, a 4-hydroxy-2-methylphenyl group, a 4-hydroxynaphthyl group, and the like. Of these, a 4-hydroxyphenyl group is more preferred.

$R^A$ represents preferably an alkyl group or an aryl group.

Examples of the halogen atom represented by X include a fluorine atom, a chlorine atom, a bromine atom, an iodine atom, and the like.

As the monovalent organic group represented by the $R^B$, an alkyl group, an alkylcarbonyl group and the like may be exemplified. The alkyl group is preferably a methyl group, an ethyl group, a n-propyl group, an isopropyl group, a n-butyl group, a isobutyl group, a sec-butyl group or a t-butyl group, and more preferably a methyl group. In addition, as the alkylcarbonyl group, a methylcarbonyl group and an ethylcarbonyl group are preferred.

$R^B$ represents preferably an alkyl group.

"a" is preferably an integer of 0 to 2, and more preferably 0 or 1.

Specific examples of the hydrolyzable silane compound represented by the above formula (i) include:

aromatic ring-containing trialkoxysilanes such as phenyltrimethoxysilane, 4-methylphenyltrimethoxysilane, 4-ethylphenyltrimethoxysilane, 4-hydroxyphenyltrimethoxysilane, 3-methylphenyltrimethoxysilane, 3-ethylphenyltrimethoxysilane, 3-hydroxyphenyltrimethoxysilane, 2-methylphenyltrimethoxysilane, 2-ethylphenyltrimethoxysilane, 2-hydroxyphenyltrimethoxysilane and 2,4,6-trimethylphenyltrimethoxysilane;

alkyltrialkoxysilanes such as methyltrimethoxysilane, methyltriethoxysilane, methyltri-n-propoxysilane, methyltri-iso-propoxysilane, methyltri-n-butoxysilane, methyltri-sec-butoxysilane, methyltri-t-butoxysilane, methyltriphenoxysilane, methyltriacetoxysilane, methyltrichlorosilane, methyltriisopropenoxysilane, methyltris(dimethylsiloxy)silane, methyltris(methoxyethoxy)silane, methyltris(methylethylketoxime)silane, methyltris(trimethylsiloxy)silane, methylsilane, ethyltrimethoxysilane, ethyltriethoxysilane, ethyltri-n-propoxysilane, ethyltri-iso-propoxysilane, ethyltri-n-butoxysilane, ethyltri-sec-butoxysilane, ethyltri-t-butoxysilane, ethyltriphenoxysilane, ethylbistris(trimethylsiloxy)silane, ethyldichlorosilane, ethyltriacetoxysilane, ethyltrichlorosilane, n-propyltrimethoxysilane, n-propyltriethoxysilane, n-propyltri-n-propoxysilane, n-propyltri-iso-propoxysilane, n-propyltri-n-butoxysilane, n-propyltri-sec-butoxysilane, n-propyltri-t-butoxysilane, n-propyltriphenoxysilane, n-propyltriacetoxysilane, n-propyltrichlorosilane, iso-propyltrimethoxysilane, iso-propyltriethoxysilane, iso-propyltri-n-propoxysilane, iso-propyltri-iso-propoxysilane, iso-propyltri-n-butoxysilane, iso-propyltri-sec-butoxysilane, iso-propyltri-t-butoxysilane, iso-propyltriphenoxysilane, n-butyltrimethoxysilane, n-butyltriethoxysilane, n-butyltri-n-propoxysilane, n-butyltri-iso-propoxysilane, n-butyltri-n-butoxysilane, n-butyltri-sec-butoxysilane, n-butyltri-t-butoxysilane, n-butyltriphenoxysilane, n-butyltrichlorosilane, 2-methylpropyltrimethoxysilane, 2-methylpropyltriethoxysilane, 2-methylpropyltri-n-propoxysilane, 2-methylpropyltri-iso-propoxysilane, 2-methylpropyltri-n-butoxysilane, 2-methylpropyltri-sec-butoxysilane, 2-methylpropyltri-t-butoxysilane, 2-methylpropyltriphenoxysilane, 1-methylpropyltrimethoxysilane, 1-methylpropyltriethoxysilane, 1-methylpropyltri-n-propoxysilane, 1-methylpropyltri-iso-propoxysilane, 1-methylpropyltri-n-butoxysilane, 1-methylpropyltri-sec-butoxysilane, 1-methylpropyltri-t-butoxysilane, 1-methylpropyltriphenoxysilane, t-butyltrimethoxysilane, t-butyltriethoxysilane, t-butyltri-n-propoxysilane, t-butyltri-iso-propoxysilane, t-butyltri-n-butoxysilane, t-butyltri-sec-butoxysilane, t-butyltri-t-butoxysilane, t-butyltriphenoxysilane, t-butyltrichlorosilane and t-butyldichlorosilane;

alkenyltrialkoxysilanes such as vinyltrimethoxysilane, vinyltriethoxysilane, vinyltri-n-propoxysilane, vinyltriisopropoxysilane, vinyltri-n-butoxysilane, vinyltri-sec-butoxysilane, vinyltri-t-butoxysilane, vinyltriphenoxysilane, allyltrimethoxysilane, allyltriethoxysilane, allyltri-n-propoxysilane, allyltriisopropoxysilane, allyltri-n-butoxysilane, allyltri-sec-butoxysilane, allyltri-t-butoxysilane and allyltriphenoxysilane;

tetraalkoxysilanes such as tetramethoxysilane, tetraethoxysilane, tetra-n-propoxysilane, tetra-iso-propoxysilane, tetra-n-butoxysilane, tetra-sec-butoxysilane and tetra-t-butoxysilane;

tetraarylsilanes such as tetraphenoxysilane;

epoxy group-containing silanes such as oxetanyltrimethoxysilane, oxiranyltrimethoxysilane, oxiranylmethyltrimethoxysilane and 3-glycidyloxypropyltrimethoxysilane;

acid anhydride group-containing silanes such as 3-(trimethoxysilyl)propylsuccinic anhydride, 2-(trimethoxysilyl)ethylsuccinic anhydride, 3-(trimethoxysilyl)propylmaleic anhydride and 2-(trimethoxysilyl)ethylglutaric anhydride; tetrahalosilanes such as tetrachlorosilane; and the like.

Of these, tetramethoxysilane, phenyltrimethoxysilane, 4-s methylphenyltrimethoxysilane, and methyltrimethoxysilane are preferred.

For the synthesis of the polysiloxane (A), in addition to the hydrolyzable silane compound represented by the above formula (i), other silane compound may be used such as, for example, disilanes such as hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,2,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, 1,2-diphenoxy-1,1,2,2-tetraphenyldisilane, bis(trimethoxysilyl)methane, bis(triethoxysilyl)methane, bis(tri-n-propoxysilyl)methane, bis(tri-isopropoxysilyl)methane, bis(tri-n-butoxysilyl)methane, bis(tri-sec-butoxysilyl)methane, bis(tri-t-butoxysilyl)methane, 1,2-bis(trimethoxysilyl)ethane, 1,2-bis(triethoxysilyl)ethane, 1,2-bis(tri-n-propoxysilyl)ethane, 1,2-bis(tri-isopropoxysilyl)ethane, 1,2-bis(tri-n-butoxysilyl)ethane, 1,2-bis(tri-sec-butoxysilyl)ethane, 1,2-bis(tri-t-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(di-isopropoxymethylsilyl)-1-(tri-isopropoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-t-butoxymethylsilyl)-1-(tri-t-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(di-isopropoxymethylsilyl)-2-(tri-isopropoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-t-butoxymethylsilyl)-2-(tri-t-butoxysilyl)ethane, bis(dimethoxymethylsilyl)methane, bis(diethoxymethylsilyl)methane, bis(di-n-propoxymethylsilyl)methane, bis(di-isopropoxymethylsilyl)methane, bis(di-n-butoxymethylsilyl)methane, bis(di-sec-butoxymethylsilyl)methane, bis(di-t-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(di-isopropoxymethylsilyl)ethane, 1,2-bis(di-n-butoxymethylsilyl)ethane, 1,2-bis(di-sec-butoxymethylsilyl)ethane, 1,2-bis(di-t-butoxymethylsilyl)ethane, bis(dimethylmethoxysilyl)methane, bis(dimethylethoxysilyl)methane, bis(dimethyl-n-propoxysilyl)methane, bis(dimethyl-isopropoxysilyl)methane, bis(dimethyl-n-butoxysilyl)methane, bis(dimethyl-sec-butoxysilyl)methane, bis(dimethyl-t-butoxysilyl)methane, 1,2-bis(dimethylmethoxysilyl)ethane, 1,2-bis(dimethylethoxysilyl)ethane, 1,2-bis(dimethyl-n-propoxysilyl)ethane, 1,2-bis(dimethyl-isopropoxysilyl)ethane, 1,2-bis(dimethyl-n-butoxysilyl)ethane, 1,2-bis(dimethyl-sec-butoxysilyl)ethane, 1,2-bis(dimethyl-t-butoxysilyl)ethane, 1-(dimethoxymethylsilyl)-1-(trimethylsilyl)methane, 1-(diethoxymethylsilyl)-1-(trimethylsilyl)methane, 1-(di-n-propoxymethylsilyl)-1-(trimethylsilyl)methane, 1-(di-isopropoxymethylsilyl)-1-(trimethylsilyl)methane, 1-(di-n-butoxymethylsilyl)-1-(trimethylsilyl)methane, 1-(di-sec-butoxymethylsilyl)-1-(trimethylsilyl)methane, 1-(di-t-butoxymethylsilyl)-1-(trimethylsilyl)methane, 1-(dimethoxymethylsilyl)-2-(trimethylsilyl)ethane, 1-(diethoxymethylsilyl)-2-(trimethylsilyl)ethane, 1-(di-n-propoxymethylsilyl)-2-(trimethylsilyl)ethane, 1-(di-isopropoxymethylsilyl)-2-(trimethylsilyl)ethane, 1-(di-n-butoxymethylsilyl)-2-(trimethylsilyl)ethane, 1-(di-sec-butoxymethylsilyl)-2-(trimethylsilyl)ethane, 1-(di-t-butoxymethylsilyl)-2-(trimethylsilyl)ethane, 1,2-bis(trimethoxysilyl)benzene, 1,2-bis(triethoxysilyl)benzene, 1,2-bis(tri-n-propoxysilyl)benzene, 1,2-bis(tri-isopropoxysilyl)benzene, 1,2-bis(tri-n-butoxysilyl)benzene, 1,2-bis(tri-sec-butoxysilyl)benzene, 1,2-bis(tri-t-butoxysilyl)benzene, 1,3-bis(trimethoxysilyl)benzene, 1,3-bis(triethoxysilyl)benzene, 1,3-bis(tri-n-propoxysilyl)benzene, 1,3-bis(tri-isopropoxysilyl)benzene, 1,3-bis(tri-n-butoxysilyl)benzene, 1,3-bis(tri-sec-butoxysilyl)benzene, 1,3-bis(tri-t-butoxysilyl)benzene, 1,4-bis(trimethoxysilyl)benzene, 1,4-bis(triethoxysilyl)benzene, 1,4-bis(tri-n-propoxysilyl)benzene, 1,4-bis(tri-isopropoxysilyl)benzene, 1,4-bis(tri-n-butoxysilyl)benzene, 1,4-bis(tri-sec-butoxysilyl)benzene and 1,4-bis(tri-t-butoxysilyl)benzene;

polycarbosilanes such as polydimethoxymethylcarbosilane and polydiethoxymethylcarbosilane; and benzyltrimethoxysilane, phenethyltrimethoxysilane, 4-s methoxyphenyltrimethoxysilane, 4-phenoxyphenyltrimethoxysilane, 4-aminophenyltrimethoxysilane, 4-dimethylaminophenyltrimethoxysilane, 4-acetylaminophenyltrimethoxysilane, 3-methoxyphenyltrimethoxysilane, 3-phenoxyphenyltrimethoxysilane, 3-aminophenyltrimethoxysilane, 3-dimethylaminophenyltrimethoxysilane, 3-acetylaminophenyltrimethoxysilane, 2-methoxyphenyltrimethoxysilane, 2-phenoxyphenyltrimethoxysilane, 2-aminophenyltrimethoxysilane, 2-dimethylaminophenyltrimethoxysilane, 2-acetylaminophenyltrimethoxysilane, 4-methylbenzyltrimethoxysilane, 4-ethylbenzyltrimethoxysilane, 4-methoxybenzyltrimethoxysilane, 4-phenoxybenzyltrimethoxysilane, 4-hydroxybenzyltrimethoxysilane, 4-aminobenzyltrimethoxysilane, 4-dimethylaminobenzyltrimethoxysilane, and 4-acetylaminobenzyltrimethoxysilane.

For hydrolytic condensation of the compound that includes the hydrolyzable silane compound represented by the above formula (i) and other silane compound which may be used as needed, well-known methods for hydrolytic condensation may be employed.

The content of the polysiloxane (A) in the composition for forming a resist underlayer film is preferably no less than 50% by mass, and more preferably no less than 55% by mass with respect to the total solid content (components excluding the solvent (B)) in the composition for forming a resist underlayer film.

With respect to the molecular weight of the polysiloxane (A), polystyrene equivalent weight average molecular weight (Mw) as determined on gel permeation chromatography (GPC) is typically 500 to 50,000, preferably 1,000 to 30,000, more preferably 1,000 to 15,000, and still more preferably 1,000 to 10,000.

The Mw herein was determined by gel permeation chromatography (GPC) on the basis of mono-dispersed polystyrene as a standard using GPC columns manufactured by Tosoh Corporation ("G2000HXL"×2; "G3000HXL"×1; and "G4000HXL"×1) under an analytical condition involving a flow rate of 1.0 mL/min and a column temperature of 40° C. with tetrahydrofuran as an elution solvent.

(B) Solvent

The solvent (B) includes (B1) an organic solvent in an amount of no less than 1% by mass and no greater than 50% by mass with respect to the total amount of the solvent (B), and (B2) water in an amount of no less than 1% by mass and no greater than 30% by mass with respect to the total amount of the solvent (B). In addition, it is preferred that the solvent (B) further includes (B3) an alcohol. Moreover, the solvent (B) may include (B4) an other solvent in addition to the organic solvent (B1), the water (B2) and the alcohol (B3).

(B1) Organic Solvent

The organic solvent (B1) has a standard boiling point of no less than 150.0° C., and the content is no less than 1% by mass and no greater than 50% by mass with respect to the total amount of the solvent (B). Due to the solvent (B) including the organic solvent (B1) in an amount falling within the range specified above, volatilization of a solvent in a nozzle during coating, and the like can be prevented, whereby generation of coating defects can be suppressed.

The standard boiling point of the organic solvent (B1) is preferably no less than 160° C., more preferably no less than 170° C., and still more preferably no less than 180° C. When the standard boiling point of the organic solvent (B1) falls within the above range, volatilization of a solvent in a nozzle during coating, and the like can be further prevented, and generation of coating defects can be further suppressed.

The standard boiling point of the organic solvent (B1) is preferably no greater than 300° C., more preferably no greater than 280° C., still more preferably no greater than 250° C., and particularly preferably no greater than 220° C.

The relative permittivity of the organic solvent (B1) is preferably 13 or greater and 200 or less, more preferably 15 or greater and 150 or less, and still more preferably 20 or greater and 100 or less.

When the relative permittivity of the organic solvent (B1) falls within the above range, the composition for forming a resist underlayer film can attain an improved inhibitory property of coating defects, and storage stability. It is speculated that due to the relative permittivity of the organic solvent (B1) falling within the above range, the silanol group in the polysiloxane (A) can be stably present, whereby a condensation reaction can be inhibited.

Examples of the organic solvent (B1) having the relative permittivity falling within the above range include ethyl acetoacetate (relative permittivity: 16), N-methylpyrrolidone (relative permittivity: 33), N,N-dimethylacetamide (relative permittivity: 39), formamide (relative permittivity: 111), N-ethylacetamide (relative permittivity: 135), N-methylacetamide (relative permittivity: 179), furfural (relative permittivity: 42), propylene carbonate (relative permittivity: 63), ethylene carbonate (relative permittivity: 90), dimethyl sulfoxide (relative permittivity: 47), sulfolane (relative permittivity: 42), ethylene glycol (relative permittivity: 41), glycerol (relative permittivity: 47), succinonitrile (relative permittivity: 63), nitrobenzene (relative permittivity: 36), γ-butyrolactone (relative permittivity: 39), and the like.

The organic solvent (B1) is exemplified by esters, alcohols, ethers, ketones, amide solvents, and the like.

Examples of the ester include:

lactones such as β-propiolactone (boiling point: 162° C.), γ-butyrolactone (boiling point: 204° C.), γ-valerolactone (boiling point: 207° C.) and γ-undecalactone (boiling point: 286° C.);

carbonates such as ethylene carbonate (boiling point: 244° C.) and propylene carbonate (boiling point: 242° C.);

3-methoxybutyl acetate (boiling point: 172° C.), 2-ethylbutyl acetate (boiling point: 160° C.), 2-ethylhexyl acetate (boiling point: 199° C.), benzyl acetate (boiling point: 212° C.), cyclohexyl acetate (boiling point: 172° C.), methylcyclohexyl acetate (boiling point: 201° C.), n-nonyl acetate (boiling point: 208° C.), methyl acetoacetate (boiling point: 169° C.), ethyl acetoacetate (boiling point: 181° C.), iso-amyl propionate (boiling point: 156° C.), diethyl oxalate (boiling point: 185° C.), di-n-butyl oxalate (boiling point: 239° C.), ethyl lactate (boiling point: 151° C.), n-butyl lactate (boiling point: 185° C.), diethyl malonate (boiling point: 199° C.), dimethyl phthalate (boiling point: 283° C.), and the like.

Examples of the alcohol include:

monoalcohols such as 3-methoxybutanol (boiling point: 157° C.), n-hexanol (boiling point: 157° C.), n-octanol (boiling point: 194° C.), sec-octanol (boiling point: 174° C.), n-nonyl alcohol (boiling point: 215° C.), n-decanol (boiling point: 228° C.), phenol (boiling point: 182° C.), cyclohexanol (boiling point: 161° C.) and benzyl alcohol (boiling point: 205° C.);

polyhydric alcohols such as ethylene glycol (boiling point: 197° C.), 1,2-propylene glycol (boiling point: 188° C.), 1,3-butylene glycol (boiling point: 208° C.), 2,4-pentanediol (boiling point: 201° C.), 2-methyl-2,4-pentanediol (boiling point: 196° C.), 2,5-hexanediol (boiling point: 216° C.) and triethylene glycol (boiling point: 165° C.);

partially etherified polyhydric alcohols such as ethylene glycol monobutyl ether (boiling point: 171° C.), ethylene glycol monophenyl ether (boiling point: 244° C.), diethylene glycol monomethyl ether (boiling point: 194° C.), diethylene glycol monoethyl ether (boiling point: 202° C.), triethylene glycol monomethyl ether (boiling point: 249° C.), diethylene glycol monoisopropyl ether (boiling point: 207° C.), diethylene glycol monobutyl ether (boiling point: 231° C.), triethylene glycol monobutyl ether (boiling point: 271° C.), ethylene glycol monoisobutyl ether (boiling point: 161° C.), diethylene glycol monoisobutyl ether (boiling point: 220° C.), ethylene glycol monohexyl ether (boiling point: 208° C.), diethylene glycol monohexyl ether (boiling point: 259° C.), ethylene glycol mono 2-ethylhexyl ether (boiling point: 229° C.), diethylene glycol mono 2-ethylhexyl ether (boiling point: 272° C.), ethylene glycol monoallyl ether (boiling point: 159° C.), diethylene glycol monophenyl ether (boiling point: 283° C.), ethylene glycol monobenzyl ether (boiling point: 256° C.), diethylene glycol monobenzyl ether (boiling point: 302° C.), dipropylene glycol monomethyl ether (boiling point: 187° C.), tripropylene glycol monomethyl ether (boiling point: 242° C.), dipropylene glycol monopropyl ether (boiling point: 212° C.), propylene glycol monobutyl ether (boiling point: 170° C.), dipropylene glycol monobutyl ether (boiling point: 231° C.) and propylene glycol monophenyl ether (boiling point: 243° C.)

Examples of the ether include
diethylene glycol dimethyl ether (boiling point: 162° C.), triethylene glycol dimethyl ether (boiling point: 216° C.), diethylene glycol methyl ethyl ether (boiling point: 176° C.), diethylene glycol diethyl ether (boiling point: 189° C.), diethylene glycol dibutyl ether (boiling point: 255° C.), dipropylene glycol dimethyl ether (boiling point: 171° C.), diethylene glycol monoethyl ether acetate (boiling point: 217° C.), ethylene glycol monobutyl ether acetate (boiling point: 188° C.), 1,8-cineole (boiling point: 176° C.), diisopentyl ether (boiling point: 171° C.), anisole (boiling point: 155° C.), ethyl benzyl ether (boiling point: 189° C.), diphenyl ether (boiling point: 259° C.), dibenzyl ether (boiling point: 297° C.), phenetole (boiling point: 170° C.), dihexyl ether (boiling point: 226° C.), and the like.

Examples of the other the organic solvent (B1) include
N-methylpyrrolidone (boiling point: 204° C.), N,N-dimethylacetamide (boiling point: 165° C.), formamide (boiling point: 210° C.), N-ethylacetamide (boiling point: 206° C.), N-methylacetamide (boiling point: 206° C.), furfural (boiling point: 162° C.), propylene carbonate (boiling point: 242° C.), ethylene carbonate (boiling point: 238° C.), dimethyl sulfoxide (boiling point: 189° C.), sulfolane (boiling point: 287° C.), glycerol (boiling point: 290° C.), succinonitrile (boiling point: 265° C.), nitrobenzene (boiling point: 211° C.), and the like.

Of these, the organic solvent (B1) is preferably an ester, an alcohol, an ether or a combination thereof, and more preferably a lactone, a carbonate or a compound represented by the following formula (B-1), or a combination thereof.

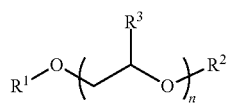

(B-1)

In the above formula (B-1), $R^1$ and $R^2$ each independently represent a hydrogen atom, an alkyl group having 1 to 4 carbon atoms or an acyl group having 1 to 4 carbon atoms; $R^3$ represents a hydrogen atom or a methyl group; n is an integer of 1 to 4, in a case where $R^3$ is present in a plurality of number, a plurality of $R^3$s are each optionally the same or different.

Examples of the alkyl group having 1 to 4 carbon atoms represented by the $R^1$ and $R^2$ include a methyl group, an ethyl group, a n-propyl group, an i-propyl group, a n-butyl group, a s-butyl group, an i-butyl group, a t-butyl group, and the like. Of these, a methyl group, an ethyl group, and an i-butyl group are preferred.

Examples of the acyl group having 1 to 4 carbon atoms represented by the $R^1$ or $R^2$ include an acetyl group, a propionyl group, a butyryl group, and the like. Of these, an acetyl group is preferred.

The organic solvent (B1) is particularly preferably ethylene glycol acetate, butyl diglycol acetate, isopropyl diglycol, butyl diglycol, isobutyl diglycol, hexyl glycol, 2-ethylhexyl glycol, phenyl glycol, phenyl diglycol, methyl propylene triglycol, propyl propylene diglycol, phenyl propylene glycol, dimethyl triglycol, methyl acetoacetate, ethyl acetoacetate, γ-butyrolactone, ethylene carbonate, propylene carbonate, propylene glycol, dimethyl sulfoxide and n-hexanol, and most preferably ethyl acetoacetate, γ-butyrolactone, dimethyl sulfoxide and n-hexanol.

It is to be noted that the organic solvent (B1) may be used in combination of two or more types thereof. The content of the organic solvent (B1) with respect to the total amount of the solvent (B) is no less than 1% by mass and no greater than 50% by mass, preferably no less than 1.5% by mass and no greater than 30% by mass, more preferably no less than 2.0% by mass and no greater than 20% by mass, and still more preferably no less than 3.0% by mass and no greater than 15% by mass. When the content of the organic solvent (B1) in the solvent (B) falls within the above range, drying of the composition for forming a resist underlayer film in a nozzle can be further prevented, whereby generation of coating defects can be further suppressed.

(B2) Water

The solvent (B) includes the water (B2). The content of the water (B2) with respect to the total amount of the solvent (B) is no less than 1% by mass and no greater than 30% by mass. Due to the solvent (B) including the water (B2) falling within the range specified above, storage stability of the composition for forming a resist underlayer film can be improved. The reasons for the improvement of the storage stability of the composition for forming a resist underlayer film due to containing the water (B2) in the solvent (B) in an amount falling within the range specified above are not necessarily clear. However, it is envisaged, for example, that modification of silanol groups included in the composition for forming a resist underlayer film is suppressed, whereby alteration of the film thickness with time is less likely to occur, and the like.

The content of the water (B2) with respect to the total amount of the solvent (B) is preferably no less than 1.0% by mass and no greater than 25% by mass, more preferably no less than 1.5% by mass and no greater than 20% by mass, particularly preferably no less than 2.0% by mass and no greater than 15% by mass, and most preferably no less than 2.5% by mass and no greater than 12 mass %. When the content of the water (B2) in the solvent (B) falls within the range specified above, storage stability of the composition for forming a resist underlayer film can be further improved.

Also, the content of the water (B2) with respect to 1 part by mass of the organic solvent (B1) is preferably no less than 0.1 parts by mass and no greater than 10 parts by mass, more preferably no less than 0.2 parts by mass and no greater than 5 parts by mass, still more preferably no less than 0.3 parts by mass and no greater than 3 parts by mass, and particularly preferably no less than 0.5 parts by mass and no greater than 2 parts by mass.

(B3) Alcohol

The alcohol (B3) has a standard boiling point of less than 150.0° C. When the solvent (B) further includes the alcohol (B3), the alcohol (B3) binds to a silanol group of the polysiloxane (A), whereby modification of the silanol group can be inhibited. Accordingly, an inhibitory property of coating defects, and storage stability of the composition for forming a resist underlayer film can be improved.

Examples of the alcohol (B3) include:
monoalcohol solvents such as methanol, ethanol and n-propanol;
partially etherified polyhydric alcohol solvents such as ethylene glycol monomethyl ether, ethylene glycol monoethyl ether, propylene glycol monomethyl ether, propylene glycol monoethyl ether and propylene glycol monopropyl ether; and the like.

Of these, propylene glycol monomethyl ether, propylene glycol monoethyl ether, and propylene glycol monopropyl ether are preferred.

The content of the alcohol (B3) with respect to the total amount of the solvent (B) is preferably no less than 0% by mass and no greater than 50% by mass, and more preferably no less than 10% by mass and no greater than 40% by mass. When the content of the alcohol (B3) falls within the above range, solubility of the polysiloxane (A) in the solvent (B) can be further improved. It is to be noted that these the alcohol (B3) may be used in combination of two or more types thereof.

(B4) Other Solvent

The solvent (B) may include (B4) other solvent in addition to the organic solvent (B1), the water (B2) and the alcohol (B3). Examples of the other solvent (B4) include:

ethers such as diethyl ether and tetrahydrofuran;

aromatic hydrocarbons such as benzene, toluene and xylene;

ketones such as acetone, methyl ethyl ketone, methyl-n-propyl ketone, methyl-n-butyl ketone, diethyl ketone, methyl-1-butyl ketone, cyclopentanone and 2,4-pentanedione;

esters such as methyl acetate, ethyl acetate, propyl acetate, isobutyl acetate, butyl acetate, ethylene glycol monomethyl ether acetate and propylene glycol monomethyl ether acetate, and the like.

Of these, esters are preferred, and propylene glycol monomethyl ether acetate is more preferred.

The content of the other solvent (B4) with respect to the total amount of the solvent (B) is preferably no less than 30% by mass and no greater than 90% by mass. Also, the other solvent (B4) may be used in combination of two or more types thereof.

(C) Acid Diffusion Controller

The composition for forming a resist underlayer film preferably contains (C) an acid diffusion controller (C). The acid diffusion controller (C) achieves effects of controlling a phenomenon of diffusion of an acid generated from a resist film upon exposure through a resist underlayer film, and inhibiting an unfavorable chemical reaction in non-exposed regions of the resist film. The form of the acid diffusion controller (C) contained in the composition for forming a resist underlayer film may be either a compound form (hereinafter, may be also referred to as "acid diffusion control agent" ad libitum) as described later or a form in which the acid diffusion controller is incorporated as a part of a polymer, or both of these forms.

Examples of the acid diffusion control agent (C) include amine compounds, amide group-containing compounds, urea compounds, nitrogen-containing heterocyclic compounds, and the like. Of these, amide group-containing compounds are preferred.

Examples of the amine compound include: mono(cyclo)alkylamines; di(cyclo)alkylamines; tri(cyclo)alkylamines; substituted alkylaniline or derivatives thereof; ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis(1-(4-aminophenyl)-1-methylethyl)benzene, 1,3-bis(1-(4-aminophenyl)-1-methylethyl)benzene, bis(2-dimethylaminoethyl)ether, bis(2-diethylaminoethyl)ether, 1-(2-hydroxyethyl)-2-imidazolidinone, 2-quinoxalinol, N,N,N',N'-tetrakis(2-hydroxypropyl)ethylenediamine, N,N,N',N''N''-pentamethyldiethylenetriamine, and the like.

Examples of the amide group-containing compound include N-t-butoxycarbonyl group-containing amino compounds, N-t-amyloxycarbonyl group-containing amino compounds, formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl) isocyanurate, and the like. Of these, N-t-butoxycarbonyl group-containing amino compounds and N-t-amyloxycarbonyl group-containing amino compounds are preferred, and N-t-butoxycarbonyl-4-hydroxypiperidine, N-t-amyloxycarbonyl-4-hydroxypiperidine, N-t-butoxycarbonyl-2-carboxy-4-hydroxypyrrolidine and N-t-butoxycarbonyl-2-carboxypyrrolidine are more preferred.

Examples of the urea compound include urea, methylurea, 1,1-dimethylurea, 1,3-dimethylurea, 1,1,3,3-tetramethylurea, 1,3-diphenylurea, tri-n-butylthiourea, and the like.

Examples of the nitrogen-containing heterocyclic compound include imidazoles such as 2-phenylimidazole; pyridines; piperazines, and the like.

Alternatively, as the acid diffusion control agent (C), an onium salt compound may be also used which is degraded upon exposure to lose basicity that serves as acid diffusion controllability. The onium salt compound is exemplified by a sulfonium salt compound represented by the following formula (2-1), an iodonium salt compound represented by the following formula (2-2), and the like.

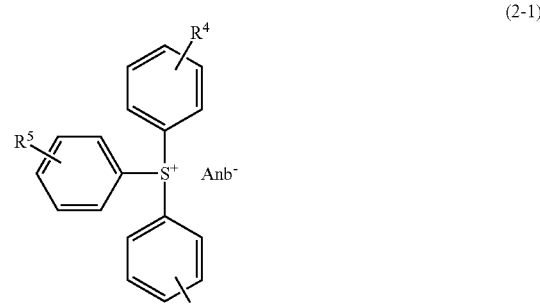

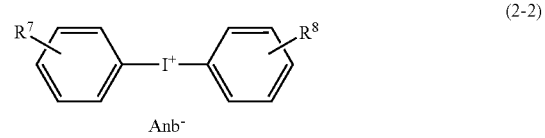

In the above formulae (2-1) and (2-2), $R^4$ to $R^8$ each independently represent a hydrogen atom, an alkyl group, an alkoxyl group, a hydroxy group or a halogen atom; $Anb^-$ represents $OH^-$, $R^9$—$COO^-$, $R^9$—$SO_3^-$, or an anion represented by the following formula (3); $R^9$ each independently represents an alkyl group, an aryl group or an alkanol group.

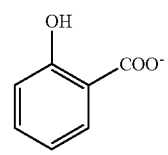

Examples of the sulfonium salt compound and the iodonium salt compound include triphenylsulfonium hydroxide, triphenylsulfonium acetate, triphenylsulfonium salicylate, diphenyl-4-hydroxyphenylsulfonium hydroxide, diphenyl-4-hydroxyphenylsulfonium acetate, diphenyl-4-hydroxyphenylsulfonium salicylate, bis(4-t-butylphenyl)iodonium hydroxide, bis(4-t-butylphenyl)iodonium acetate, bis(4-t-butylphenyl)iodonium hydroxide, bis(4-t-butylphenyl)iodonium acetate, bis(4-t-butylphenyl)iodonium salicylate, 4-t-butylphenyl-4-hydroxyphenyliodonium hydroxide, 4-t-butylphenyl-4-hydroxyphenyliodonium acetate, 4-t-butylphenyl-4-hydroxyphenyliodonium salicylate, bis(4-t-butylphenyl)iodonium 10-camphorsulfonate, diphenyliodonium 10-camphorsulfonate, triphenylsulfonium 10-camphorsulfonate, 4-t-butoxyphenyldiphenylsulfonium 10-camphorsulfonate, and the like.

The acid diffusion control agent (C) may be used in combination of two or more types thereof. The content of the acid diffusion control agent (C) with respect to the total solid content (components excluding the solvent (B)) in the composition for forming a resist underlayer film is preferably no less than 1% by mass and no greater than 20% by mass, and more preferably no less than 2% by mass and no greater than 10% by mass. When the content of the acid diffusion control agent (C) falls within the range specified above, pattern developability and the like can be further improved.

Other Optional Component

The composition for forming a resist underlayer film may contain other optional component as needed within a range not leading to impairment of the effects of the present invention. The other optional component is exemplified by a surfactant, a storage stabilizer, and the like.

Preparation Method of Composition for Forming a Resist Underlayer Film

The composition for forming a resist underlayer film is prepared by, for example, mixing the polysiloxane (A), the acid diffusion control agent (C) and as needed other optional component in the solvent (B) at a predetermined ratio. The composition for forming a resist underlayer film is used preferably in a state being dissolved or dispersed in an appropriate solvent.

Pattern-Forming Method

The pattern-forming method of the embodiment of the present invention includes the steps of:

providing a resist underlayer film on a substrate using the composition for forming a resist underlayer film (hereinafter, may be also referred to as "resist underlayer film-providing step");

providing a resist film on the resist underlayer film using a resist composition (hereinafter, may be also referred to as "resist film-providing step");

exposing the resist film by irradiation with a radioactive ray through a mask (hereinafter, may be also referred to as "exposure step");

developing the exposed resist film to form a resist pattern (hereinafter, may be also referred to as "development process"); and sequentially dry-etching the resist underlayer film and the substrate using the resist pattern as a mask (hereinafter, may be also referred to as "dry-etching step").

According to the pattern-forming method, a resist underlayer film that is superior in the inhibitory property of coating defects can be provided since the composition for forming a resist underlayer film of the embodiment of the present invention is used. In addition, even if the composition for forming a resist underlayer film which had been stored for a long period of time is used, favorable patterns can be obtained.

Therefore, the pattern-forming method is responsible for formation of a finer pattern on a substrate.

Resist Underlayer Film-Providing Step

In this step, a resist underlayer film is provided on a substrate using the composition for forming a resist underlayer film. Examples of the substrate include interlayer insulating films such as wafers coated with an insulating film (e.g., silicon oxide, silicon nitride, silicon oxynitride, polysiloxane, etc.), or with a low-dielectric-constant insulating film (e.g., Black Diamond (manufactured by AMAT (Applied Materials, Inc.)), SiLK (manufactured by Dow Chemical Company), LKD5109 (manufactured by JSR Corporation), etc.). A patterned substrate provided with a wiring gutter (trench), a plug groove (via), or the like may also be used as the substrate.

With respect to a method for providing the resist underlayer film, for example, a coated film of the composition may be provided by coating on the surface of a substrate and/or other underlayer film, etc., and the coated film may be subjected to a heat treatment, or both irradiation with an ultraviolet ray and a heat treatment to allow for hardening, whereby the resist underlayer film can be provided. The method for coating the composition for forming a resist underlayer film is exemplified by a spin-coating method, a roll coating method, a dipping method, and the like. Of these, a spin coating method in which the composition for forming a resist underlayer film is sprayed using a nozzle is preferred. When this method is used among the foregoings, the effects of the embodiment of the present invention can be sufficiently achieved. In addition, the heating temperature is typically 50° C. to 450° C., and preferably 250° C. The heating time period is typically 30 sec to 1,200 sec, and preferably 45 sec to 600 sec.

In addition, the substrate may be provided beforehand with other underlayer film that is different from the resist underlayer film provided using the composition for forming a resist underlayer film of the embodiment of the present invention (hereinafter, may be also referred to as "other underlayer film"). An antireflective function, flatness of coated films, high etching resistance to fluorine-containing gas such as $CF_4$, or the like may be imparted to the other underlayer film. As the other underlayer film, commercially available products such as e.g., "NFC HM8005" (manufactured by JSR Corporation), "NFC CT08" (manufactured by JSR Corporation) may be used.

The film thickness of the resist underlayer film is typically no less than 5 nm and no greater than 200 nm, and is preferably no less than 10 nm and no greater than 100 nm for improving patterning properties.

Resist Film-Providing Step

In this step, a resist film is provided using a resist composition on the resist underlayer film obtained in the resist underlayer film-providing step.

The resist composition is exemplified by a positive or negative chemically amplified type resist composition containing a photoacid generating agent, a positive type resist composition constituted with an alkali-soluble resin and a quinone diazide based photosensitizing agent, a negative type resist composition constituted with an alkali-soluble resin and a crosslinking agent, and the like. Alternatively, a resist composition filtered through a filter having a pore size of about 0.2 μm may be suitably used. It is to be noted that a commercially available resist composition may be used as is in the pattern-forming method of the embodiment of the present invention.

The coating method of the resist composition is not particularly limited, and for example, a conventional method such as a spin coating method may be employed. It is to be noted that upon coating the resist composition, the amount of the resist composition to be coated is adjusted such that the resulting resist film has a predetermined film thickness.

The resist film can be provided by prebaking a coated film provided by coating the resist composition to allow a solvent in the coated film (i.e., a solvent contained in the resist composition) to be volatilized. The temperature employed upon the prebaking may be appropriately adjusted according to the type and the like of the resist composition used, but is preferably 30° C. to 200° C., and more preferably 50° C. to 150° C. It is to be noted that other coated film such as a liquid immersion upper layer film may be further provided on the surface of the resist film. The pre-baking time period is preferably 20 sec to 300 sec, and more preferably 40 sec to 150 sec. The film thickness of the resist film is preferably 5 nm to 500 nm, and more preferably 10 nm to 300 nm.

Exposure Step

In this step, the resist film is exposed by irradiation with a radioactive ray through a mask.

The radioactive ray used in this step is appropriately selected from among visible light rays, ultraviolet rays, far ultraviolet rays, X-rays, electron beams, γ-rays, molecular beams, ion beam and the like in accordance with the type of the acid generating agent used in the resist composition. Far ultraviolet rays are preferred, and a KrF excimer laser beam (248 nm), an ArF excimer laser beam (193 nm), an $F_2$ excimer laser beam (157 nm), a $Kr_2$ excimer laser beam (147 nm), an ArKr excimer laser beam (134 nm) and extreme ultraviolet rays (13.5 nm, etc.) are more preferred.

Also, the exposure method is not particularly limited, and may be carried out according to a method employed in conventionally well-known pattern formation. Alternatively, a liquid immersion lithography process may be also employed.

Development Step

In this step, the resist film exposed in the exposure step is developed to form a resist pattern.

The developer solution for use in the development may be appropriately selected in accordance with the type of the resist composition used. In cases where a positive chemically amplified type resist composition or a positive type resist compositions containing an alkali-soluble resin is used, an alkaline aqueous solution of, for example, sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo[5.4.0]-7-undecene, 1,5-diazabicyclo[4.3.0]-5-nonene or the like may be employed. Also, a water soluble organic solvent, for example, an alcohol such as methanol or ethanol, as well as a surfactant may be added in an appropriate amount to the alkaline aqueous solution.

Also, in cases where a negative chemically amplified type resist composition or a negative type resist containing an alkali-soluble resin is used, an aqueous solution of an alkali, for example, an inorganic alkali such as sodium hydroxide, potassium hydroxide, sodium carbonate, sodium silicate, sodium metasilicate or aqueous ammonia, a primary amine such as ethylamine or n-propylamine, a secondary amine such as diethylamine or di-n-butylamine, an alcohol amine such as triethylamine or methyldiethylamine, a quaternary amine such as dimethylethanolamine or triethanolamine, a quaternary ammonium salt such as tetramethylammonium hydroxide, tetraethylammonium hydroxide or choline, a cyclic amine such as pyrrole or piperidine, or the like may be employed.

In this step, after the development carried out with the developer solution, washing and drying enable a given resist pattern to be formed corresponding to the photomask.

Note that carrying out post-baking in this step is preferred before the development is carried out (i.e., after the exposure carried out in the exposure step) in order to improve the resolution, pattern profile, developability and the like. The post-baking temperature may be appropriately adjusted depending on the type of the resist composition used, and the like. The post-baking temperature is preferably 50 to 200° C., and more preferably 80 to 150° C. The post-baking time period is preferably 30 sec to 300 sec, and more preferably 40 sec to 150 sec.

Dry-Etching Step

In this step, the resist underlayer film and the substrate are sequentially dry-etched using the resist pattern Is as a mask to form a pattern. The dry etching may be effected using any well-known dry etching apparatus. In addition, depending on the elemental composition of the object to be etched, oxygen atom-containing gases such as $O_2$, CO, and $CO_2$, inert gases such as He, $N_2$, and Ar, chlorine based gases such as $Cl_2$ and $BCl_3$, fluorine based gases such as $CHF_3$ and $CF_4$, other gases such as $H_2$ and $NH_3$ can be used as a source gas in the dry etching. It is to be noted that these gases may also be used in mixture.

In addition, the pattern-forming method may include a step of removing a resist underlayer film remaining on the substrate after these processes.

EXAMPLES

The present invention will be explained below in detail by way of Examples, but the present invention should not be construed as being limited to the Examples. Methods of the determination of various types of physical property values are shown below.

Solid Content Concentration of a Solution Containing Polysiloxane (A)

The solid content concentration (% by mass) of a solution containing the polysiloxane (A) was determined by baking 0.5 g of the solution containing the polysiloxane (A) at 250° C. for 30 min and measuring the mass of the solid content in the solution.

Determination of Mw

Mw was determined by gel permeation chromatography (GPC) on the basis of mono-dispersed polystyrene as a standard using GPC columns (G2000HXL×2; G3000HXL×1; and G4000HXL×1, manufactured by Tosoh Corporation) under an analytical condition involving a flow rate of 1.0 mL/min and a column temperature of 40° C. with tetrahydrofuran as an elution solvent.

Synthesis of Polysiloxane (A)

Each monomer used for synthesis of the polysiloxane (A) is shown below.

M-1: tetramethoxysilane, compound represented by the following formula (M-1)

M-2: phenyltrimethoxysilane, compound represented by the following formula (M-2)

M-3: 4-methylphenyltrimethoxysilane, compound represented by the following formula (M-3)

M-4: methyltrimethoxysilane, compound represented by the following formula (M-4)

Si(OMe)₄ (M-1)

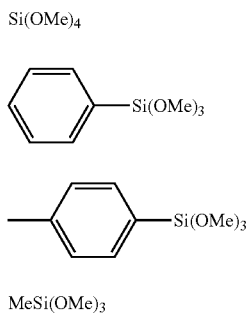
(M-2)

(M-3)

MeSi(OMe)₃ (M-4)

Synthesis Example 1

An aqueous oxalic acid solution was prepared by dissolving 0.55 g of oxalic acid in 7.66 g of water. Subsequently, a flask charged with 12.95 g of the compound (M-1), 5.80 g of the compound (M-2), 3.01 g of the compound (M-3), and 70.03 g of propylene glycol-1-ethyl ether was fitted with a condenser and a dropping funnel containing the aqueous oxalic acid solution prepared. Next, after heating the mixture to 60° C. in an oil bath, the aqueous oxalic acid solution was slowly added dropwise to permit a reaction at 60° C. for 2 hrs. After completion of the reaction, the flask containing the reaction solution was allowed to cool, and fitted with an evaporator. Methanol generated by the reaction was removed to obtain 49.2 g of a solution containing (A-1) a polysiloxane. The solid content concentration in the resultant solution was 10% by mass. Also, the Mw of the polysiloxane (A-1) was 1,500.

Synthesis Example 2 and Synthesis Example 3

Polysiloxanes (A-2) and (A-3) were synthesized in a similar manner to Synthesis Example 1 except that monomers of the type and amount shown in Table 1 were used. The Mw and the solid content concentration of each synthesized polysiloxane are together shown in Table 1.

TABLE 1

| | (A) Polysiloxane | Type of monomer | Amount used (g) | Amount used (mol %) | Mw | Solid content concentration (% by mass) |
|---|---|---|---|---|---|---|
| Synthesis Example 1 | A-1 | M-1 | 12.95 | 60 | 1.500 | 10 |
| | | M-2 | 5.8 | 30 | | |
| | | M-3 | 3.01 | 10 | | |
| Synthesis Example 2 | A-2 | M-1 | 15.97 | 50 | 2.000 | 14 |
| | | M-2 | 12.87 | 45 | | |
| | | M-4 | 2.08 | 5 | | |
| Synthesis Example 3 | A-3 | M-1 | 19.85 | 60 | 2.500 | 16 |
| | | M-2 | 7.4 | 25 | | |
| | | M-3 | 4.61 | 10 | | |
| | | M-4 | 2.15 | 5 | | |

Preparation of Composition for Forming a Resist Underlayer Film

Each component other than the polysiloxane (A) used for preparation of each composition for forming a resist underlayer film is shown below.

(B) Solvent
B1-1: Ethyl Acetoacetate
(standard boiling point: 180.8° C.; relative permittivity: 15.9)
B1-2: γ-Butyrolactone
(standard boiling point: 204° C.; relative permittivity: 39)
B1-3: Dimethyl Sulfoxide
(standard boiling point: 189.0° C.; relative permittivity: 48.9)
B1-4: n-Hexanol
(standard boiling point: 157° C.; relative permittivity: 13.3)
B2: water
B3-1: propylene glycol-1-methyl ether
B3-2: propylene glycol-1-ethyl ether
B3-3: propylene glycol-1-propyl ether
B4: propylene glycol monomethyl ether acetate
(C) Acid Diffusion Control Agent
C-1: N-t-amyloxycarbonyl-4-hydroxypiperidine, compound represented by the following formula (C-1)
C-2: N-t-butoxycarbonyl-4-hydroxypiperidine, compound represented by the following formula (C-2)
C-3: N-t-butoxycarbonyl-2-carboxy-4-hydroxypyrrolidine, compound represented by the following formula (C-3)
C-4: N-t-butoxycarbonyl-2-carboxypyrrolidine, compound represented by the following formula (C-4)

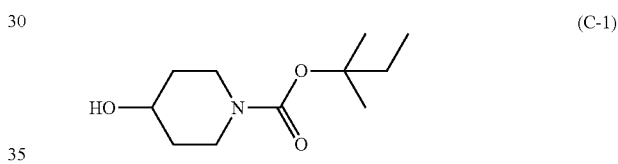
(C-1)

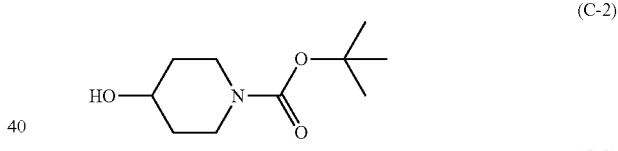
(C-2)

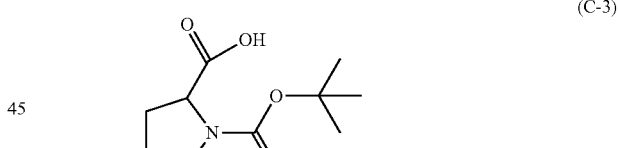
(C-3)

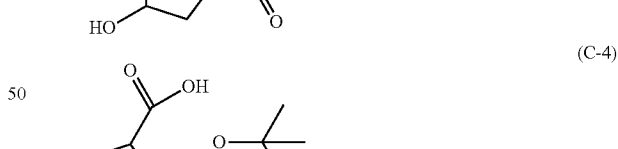
(C-4)

Example 1

A solution was obtained by mixing 2.10 parts by mass of (A-1) as the polysiloxane (A), 4.50 parts by mass of (B1-1) as the solvent (B), 7.00 parts by mass of the water (B2), 30.00 parts by mass of (B3-1) and 56.35 parts by mass of (B4), and 0.05 parts by mass of (C-1) as the acid diffusion control agent (C). Then, the solution was filtered through a filter having a pore size of 0.2 μm to prepare a composition for forming a resist underlayer film.

Examples 2 to 16 and Comparative Examples 1 to 2

Each composition for forming a resist underlayer film was prepared in a similar manner to Example 1 except that each component of the type and the proportion contained as shown in Table 2 was mixed. It is to be noted that "-" denotes that the corresponding component was not used.

each resist underlayer film was provided similarly to the foregoing, and the film thickness of the resultant film was measured. The average film thickness was calculated, which was defined as film thickness after storage (T). Then the difference (T−T0) between the initial film thickness T0 and the film thickness after storage T was calculated, and the proportion of the difference with respect to the initial film

TABLE 2

| | (A) Component | | (B) Solvent | | | | | | | | (C) Acid diffusion control agent | |
|---|---|---|---|---|---|---|---|---|---|---|---|---|
| | | | (B1) Organic solvent | | (B2) Water | | (B3) Alcohol | | (B4) Other solvent | | | |
| | type | content (parts by mass) | type | content (parts by mass) | type | content (parts by mass) | type | content (parts by mass) | type | content (parts by mass) | type | content (parts by mass) |
| Example 1 | A-1 | 2.10 | B1-1 | 4.50 | B2 | 7.00 | B3-1 | 30.00 | B4 | 56.35 | C-1 | 0.05 |
| Example 2 | A-1 | 1.95 | B1-2 | 5.50 | B2 | 5.00 | B3-1 | 25.00 | B4 | 62.52 | C-1 | 0.03 |
| Example 3 | A-1 | 1.70 | B1-3 | 8.50 | B2 | 3.50 | B3-1 | 20.00 | B4 | 66.28 | C-1 | 0.02 |
| Example 4 | A-1 | 2.23 | B1-4 | 7.30 | B2 | 6.50 | B3-1 | 23.00 | B4 | 60.90 | C-1 | 0.07 |
| Example 5 | A-1 | 2.07 | B1-1 | 7.00 | B2 | 8.30 | B3-2 | 31.00 | B4 | 51.62 | C-1 | 0.01 |
| Example 6 | A-1 | 1.83 | B1-1 | 5.00 | B2 | 4.50 | B3-3 | 18.00 | B4 | 70.63 | C-1 | 0.04 |
| Example 7 | A-2 | 1.91 | B1-1 | 6.50 | B2 | 5.50 | B3-1 | 28.00 | B4 | 58.01 | C-1 | 0.08 |
| Example 8 | A-3 | 2.38 | B1-1 | 7.00 | B2 | 6.50 | B3-1 | 30.00 | B4 | 54.06 | C-1 | 0.06 |
| Example 9 | A-1 | 2.03 | B1-1 | 4.40 | B2 | 4.60 | B3-1 | 22.00 | B4 | 66.93 | C-2 | 0.04 |
| Example 10 | A-1 | 2.11 | B1-1 | 6.00 | B2 | 8.50 | B3-1 | 27.00 | B4 | 56.36 | C-3 | 0.03 |
| Example 11 | A-1 | 2.57 | B1-1 | 3.80 | B2 | 10.30 | B3-1 | 20.00 | B4 | 63.28 | C-4 | 0.05 |
| Example 12 | A-1 | 1.89 | B1-1 | 5.50 | B2 | 2.00 | B3-1 | 23.00 | B4 | 67.54 | C-1 | 0.07 |
| Example 13 | A-1 | 2.14 | B1-1 | 8.00 | B2 | 14.00 | B3-1 | 35.00 | B4 | 40.84 | C-1 | 0.02 |
| Example 14 | A-1 | 2.10 | B1-1 | 2.50 | B2 | 10.00 | B3-1 | 30.00 | B4 | 55.34 | C-1 | 0.06 |
| Example 15 | A-1 | 1.99 | B1-1 | 10.00 | B2 | 14.00 | B3-1 | 38.00 | B4 | 35.98 | C-1 | 0.03 |
| Example 16 | A-3 | 1.90 | B1-1 | 3.00 | B2 | 3.00 | B3-1 | 12.00 | B4 | 80.06 | C-1 | 0.04 |
| Comparative Example 1 | A-1 | 2.09 | — | — | B2 | 5.00 | B3-1 | 30.00 | B4 | 72.86 | C-1 | 0.05 |
| Comparative Example 2 | A-1 | 1.85 | B1-1 | 6.00 | — | — | B3-1 | 20.00 | B4 | 72.09 | C-1 | 0.06 |

Each of the prepared composition for forming a resist underlayer films was evaluated as in the following. The results are shown in Table 3.

Inhibitory Properties of Coating Defects in Providing Coated Film

Each of the prepared compositions for forming a resist underlayer film was coated on the surface of a silicon wafer by a spin coating method using a coater/developer (manufactured by CLEAN TRACK ACT12, Tokyo Electron Limited), and then dried on a hot plate at 220° C. for 60 sec to provide each resist underlayer film having a film thickness of 30 nm. Thereafter, the number of coating defects was counted using a a surface defect inspection device (KLA2800, manufactured by KLA Tencor). According to the number of the coating defects, evaluation was made as: "A" when the number was no greater than 100; "B" when the number was no less than 101 and no greater than 150; and "C" when the number was greater than 150.

Evaluation on Storage Stability (1)
Inhibitory Properties of Alteration of Film Thickness with Time Each composition for forming a resist underlayer film was coated on the surface of a silicon wafer using a spin coater under a condition involving a number of revolution of 2,000 rpm for 20 sec, and dried on a hot plate at 250° C. for 60 sec to provide each resist underlayer film. The film thickness of each of the provided resist underlayer films was measured using an optical film thickness meter (UV-1280SE, manufactured by KLA Tencor) at 50 points, and the average film thickness was calculated, which was defined as initial film thickness (T0). Moreover, using each composition for forming a resist underlayer film after heating at 80° C. for 6 hrs, thickness T0, i.e., "(T−T0)/T0" was calculated as a proportion of film thickness alteration. According to the calculated value, evaluation was made as: "A" when the value was no greater than 5%; "B" when the value was greater than 5% and no greater than 8%; and "C" when the value was greater than 8%.

Evaluation on Storage Stability (2)
Inhibitory Properties of Coating Defects with Time Each composition for forming a resist underlayer film was coated on the surface of a silicon wafer using a spin coater under a condition involving a number of revolution of 2,000 rpm for 20 sec, and dried on a hot plate at 250° C. for 60 sec to provide each resist underlayer film. The number of coating defects of each of the provided resist underlayer films was counted using a surface defect inspection device (KLA2800, manufactured by KLA Tencor), which was defined as initial coating defect number (D0). Moreover, using each composition for forming a resist underlayer film after heating at 40° C. for one week, the resist underlayer film was provided similarly to the foregoing, and the number of coating defects was counted, which was defined as coating defect number after storage (D). Then the difference (D−D0) between the initial coating defect number D0 and the coating defect number after storage D was calculated as an increase in the number of coating defects. According to the calculated value, evaluation was made as: "A" when the value was no greater than 100; "B" when the value was no less than 101 and no greater than 200; and "C" when the value was greater than 200.

Adhesiveness

Other underlayer film-forming material ("NFC HM8005", manufactured by JSR Corporation) was coated on a silicon wafer using a spin coater, and dried on a hot plate at 250° C.

for 60 sec to provide other underlayer film having a film thickness of 300 nm. Each composition for forming a resist underlayer film prepared in the Examples and Comparative Examples was coated on the surface of the other underlayer film using a spin coater, and baked on a hot plate at 250° C. for 60 sec to provide each resist underlayer film having a film thickness of 30 nm. Next, a resist composition ("ARX2014J", manufactured by JSR Corporation) was coated on each resist underlayer film, and dried at 90° C. for 60 sec to provide a resist film having a film thickness of 100 nm. Furthermore, a liquid immersion upper layer film-forming material ("NFC TCX091-7", manufactured by JSR Corporation) was coated on the resist film provided, and dried at 90° C. for 60 sec to provide a liquid immersion upper layer film having a film thickness of 30 nm. Then the substrate was subjected to irradiation under a condition involving 16 mJ/cm² using an ArF excimer laser irradiation device ("S610C", manufactured by Nikon Corporation), and thereafter heated at 115° C. for 60 sec. Subsequently, a development process was carried out with a 2.38% by mass aqueous tetramethylammonium hydroxide (TMAH) solution for 30 sec to form a resist pattern, a line and space pattern having a line width of 50 nm. The resist pattern formed on the substrate in this manner was observed using a scanning electron microscope (SEM), and evaluation was made as: "A" when peeling resulting from development did not occur; and "B" when peeling resulting from development occurred.

TABLE 3

| | Storage stability | | | |
| | Inhibitory property of coating defects in providing coated film | Inhibitory property of alteration of film thickness with time | Inhibitory property of coating defects with time | Adhesiveness |
|---|---|---|---|---|
| Example 1 | A | A | A | A |
| Example 2 | A | A | A | A |
| Example 3 | A | A | A | A |
| Example 4 | A | A | A | A |
| Example 5 | A | A | A | A |
| Example 6 | A | A | A | A |
| Example 7 | A | A | A | A |
| Example 8 | A | A | A | A |
| Example 9 | A | A | A | A |
| Example 10 | A | A | A | A |
| Example 11 | A | A | A | A |
| Example 12 | A | A | B | A |
| Example 13 | A | A | B | A |
| Example 14 | B | A | A | A |
| Example 15 | A | A | B | A |
| Example 16 | B | A | A | A |
| Comparative Example 1 | C | A | A | A |
| Comparative Example 2 | A | C | C | A |

As is clear from the results shown in Table 3, it was proven that the composition for forming a resist underlayer film of the embodiment of the present invention enables the number of defects generated in providing a coated film to be decreased. In addition, it was revealed that since the composition for forming a resist underlayer film of the embodiment of the present invention is accompanied by a little increase in the number of defects with time, as well as less alteration of the film thickness of the provided resist underlayer film with time, superior storage stability is attained. Furthermore, it was revealed that a resist underlayer film that is superior in adhesiveness to resist films can be provided according to the composition for forming a resist underlayer film of the embodiment of the present invention.

The composition for forming a resist underlayer film of the embodiment of the present invention is superior in an inhibitory property of coating defects, and storage stability. Therefore, the composition for forming a resist underlayer film and pattern-forming method can be suitably used in lithography processes for which further miniaturization has been demanded.

Obviously, numerous modifications and variations of the present invention are possible in light of the above teachings. It is therefore to be understood that within the scope of the appended claims, the invention may be practiced otherwise than as specifically described herein.

What is claimed is:

1. A composition for forming a resist underlayer film, comprising:
    a polysiloxane;
    an acid diffusion controller; and
    a solvent comprising:
        an organic solvent having a standard boiling point of no less than 150.0° C.; and
        water,
    wherein a content of the organic solvent is no less than 1% by mass and no greater than 50% by mass with respect to a total amount of the solvent, and
    a content of water is no less than 1% by mass and no greater than 30% by mass with respect to the total amount of the solvent.

2. The composition according to claim 1, wherein the standard boiling point of the organic solvent is no less than 180° C.

3. The composition according to claim 1, wherein the organic solvent is an ester, an alcohol, an ether or a combination thereof.

4. The composition according to claim 1, wherein the organic solvent is a lactone, a carbonate, a compound represented by formula (B-1), or a combination thereof,

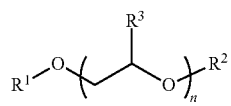

(B-1)

wherein, in the formula (B-1), $R^1$ and $R^2$ each independently represent a hydrogen atom, an alkyl group having 1 to 4 carbon atoms or an acyl group having 1 to 4 carbon atoms; $R^3$ represents a hydrogen atom or a methyl group; n is an integer of 1 to 4, in a case where $R^3$ is present in a plurality of number, a plurality of $R^a$s are each a same or different.

5. The composition according to claim 1, wherein a relative permittivity of the organic solvent is 13 or greater and 200 or less.

6. The composition according to claim 1, wherein the solvent further comprises an alcohol other than the organic solvent.

7. The composition according to claim 1, wherein the polysiloxane is a hydrolytic condensate of a compound comprising a hydrolyzable silane compound represented by formula (i):

$$R^A{}_a SiX_{4-a} \qquad (i)$$

wherein, in the formula (i), $R^A$ represents a hydrogen atom, a fluorine atom, an alkyl group having 1 to 5 carbon atoms, an alkenyl group having 2 to 10 carbon atoms, an aryl group having 6 to 20 carbon atoms or a cyano group, wherein a part or all of hydrogen atoms included in the alkyl group represented by $R^A$ are not substituted or substituted by an epoxyalkyloxy group, an epoxy group, an acid anhydride group or a cyano group, and a part or all of hydrogen atoms included in the aryl group represented by $R^A$ are not substituted or substituted by a hydroxy group; X represents a halogen atom or —$OR^B$, wherein $R^B$ represents a monovalent organic group; a is an integer of 0 to 3, wherein in a case where $R^A$ and X are each present in a plurality of number, a plurality of $R^A$s are each a same or different and a plurality of Xs are each a same or different.

8. A pattern-forming method comprising:
providing a resist underlayer film on a substrate using the composition according to claim 1;
providing a resist film on the resist underlayer film using a resist composition;
exposing the resist film by irradiation with a radioactive ray through a mask;
developing the exposed resist film to form a resist pattern; and
sequentially dry-etching the resist underlayer film and the substrate using the resist pattern as a mask.

9. The composition according to claim 1, wherein the acid diffusion controller comprises an amine compound, an amide group-containing compound, a urea compound, a nitrogen-containing heterocyclic compound, or a combination thereof.

10. The composition according to claim 1, wherein the acid diffusion controller comprises an amide group-containing compound.

11. The composition according to claim 1, wherein the acid diffusion controller comprises an onium salt compound which is degraded upon exposure to light to lose basicity.

12. The composition according to claim 1, wherein a content of the acid diffusion controller with respect to a total solid content in the composition is no less than 1% by mass and no greater than 20% by mass.

13. The composition according to claim 1, wherein a content of the acid diffusion controller with respect to a total solid content in the composition is no less than 2% by mass and no greater than 10% by mass.

* * * * *

UNITED STATES PATENT AND TRADEMARK OFFICE
CERTIFICATE OF CORRECTION

PATENT NO.         : 9,116,427 B2                                   Page 1 of 1
APPLICATION NO.    : 13/787674
DATED              : August 25, 2015
INVENTOR(S)        : Shunsuke Kurita et al.

It is certified that error appears in the above-identified patent and that said Letters Patent is hereby corrected as shown below:

IN THE CLAIMS

Column 24, Line 52, "a plurality of $R^a$s" should read -- a plurality of $R^3$s --.

Signed and Sealed this
Sixteenth Day of February, 2016

Michelle K. Lee
*Director of the United States Patent and Trademark Office*